(12) United States Patent
Howard

(10) Patent No.: US 10,686,463 B1
(45) Date of Patent: Jun. 16, 2020

(54) METHOD FOR CALIBRATION OF DIGITAL READOUT WITH SPLIT COUNTER AND RESIDUAL BITS

(71) Applicant: Government of the United States as represented by the Secretary of the Air Force, Wright-Patterson AFB, OH (US)

(72) Inventor: Matthew D. Howard, Beavercreek, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 16/275,488

(22) Filed: Feb. 14, 2019

(51) Int. Cl.
*H03M 1/10* (2006.01)
*G06F 17/11* (2006.01)
*G06F 30/331* (2020.01)

(52) U.S. Cl.
CPC ......... *H03M 1/1023* (2013.01); *G06F 17/11* (2013.01); *G06F 30/331* (2020.01); *H03M 1/1004* (2013.01); *H03M 1/1052* (2013.01)

(58) Field of Classification Search
CPC ...... H03M 1/50; H03M 1/0643; H03M 1/069; H03M 1/1004; H03M 1/12; H03M 1/124; H03M 1/1245; H03M 1/164; H03M 1/201; H03M 1/361; H03M 1/44; H03M 1/52; H03M 1/60; H03M 1/1028; H03M 1/06; H03M 1/1023; H03M 1/1061; H03M 1/1071; H03M 1/466; H03M 1/468; H03M 1/1042; H03M 1/1047; H03M 1/1057; H03M 3/388

USPC ................. 341/118–121, 155, 156
See application file for complete search history.

(56) References Cited

U.S. PATENT DOCUMENTS

| | | | | |
|---|---|---|---|---|
| 5,101,206 A | * | 3/1992 | Riedel | H03M 1/14 341/120 |
| 5,926,123 A | * | 7/1999 | Ostrom | H03M 1/0641 341/120 |
| 6,252,536 B1 | * | 6/2001 | Johnson | H03M 1/187 330/253 |
| 6,707,492 B1 | * | 3/2004 | Itani | H03M 1/187 341/139 |
| 7,312,734 B2 | | 12/2007 | McNeil et al. | |

(Continued)

FOREIGN PATENT DOCUMENTS

CN 102163973 A 8/2011

OTHER PUBLICATIONS

Machine Translation, CN102163973, Google Patents (2011) 8 pages total.

*Primary Examiner* — Linh V Nguyen
(74) *Attorney, Agent, or Firm* — AFMCLO/JAZ; Matthew Fair

(57) ABSTRACT

In accordance with various embodiments of the disclosed subject matter, a system, device, apparatus and method for calibrating a split bit digital readout to avoid misalignment of the least significant counter bit (i.e., the LSB of the M most significant bits) and most significant residual bit (i.e. the MSB of the N least significant bits). For example, various embodiments provide a field programmable gate array (FPGA), digital signal processing (DSP) function and the like configured to calibrate one or many split bit digital readouts such as may exist on a digital pixel sensor (DPS) or other device.

20 Claims, 3 Drawing Sheets

(56) References Cited

U.S. PATENT DOCUMENTS

| | | | |
|---|---|---|---|
| 7,378,999 B1* | 5/2008 | McGrath | H03M 1/1028 |
| | | | 341/120 |
| 9,197,233 B2 | 11/2015 | Gaalema et al. | |
| 9,496,884 B1* | 11/2016 | Azenkot | H03M 1/1023 |
| 9,571,115 B1 | 2/2017 | Beukema et al. | |
| 10,483,995 B1* | 11/2019 | Lok | H03M 1/1071 |
| 2003/0132867 A1* | 7/2003 | Ostrom | H03M 1/109 |
| | | | 341/120 |
| 2013/0088375 A1* | 4/2013 | Wu | H03M 1/1047 |
| | | | 341/120 |
| 2016/0182074 A1* | 6/2016 | Speir | H03M 1/1019 |
| | | | 341/120 |
| 2017/0237268 A1 | 8/2017 | Brannick et al. | |
| 2018/0175874 A1* | 6/2018 | Ding | H03M 1/1009 |

* cited by examiner

METHOD FOR CALIBRATION OF DIGITAL READOUT WITH SPLIT COUNTER AND RESIDUAL BITS

GOVERNMENT INTEREST

The invention described herein may be manufactured and used by or for the Government of the United States for all governmental purposes without the payment of any royalty.

FIELD OF THE DISCLOSURE

The present invention generally relates to split bit digital readouts such as in-pixel digital readouts.

BACKGROUND

Advanced focal plane arrays (FPAs), such as infrared focal plane arrays (IRFPAs) utilize embedded analog-to-digital converters (ADCs) on the read out integrated circuitry (ROIC) die to enable on-chip digital signal processing, increased dynamic range, and increased signal to noise ratio. On-ROIC ADC is often incorporated at one or more FPA outputs or at ROIC columns. More ADCs on the ROIC tend to provide increased digital resolution and reduced ADC power due to reduced digitization frequency.

A digital pixel sensor (DPS) utilizes one on-ROIC ADC per pixel to take advantage of the benefits of on-chip digital processing. Specifically, in-pixel digital readouts enable an increase in the well depth of sensors while avoiding large integration capacitors. However, to avoid high quantization noise, some readouts are implementing split bits where the M most significant come from an in-pixel digital counter, and the N least significant come from a conventional analog-to-digital convertor that digitizes residual charge on the integration capacitor at the end of the frame. It is further noted that high performance longwave infrared imaging systems require large well depths to improve signal-to-noise ratio due to high background emission, which further encourages the use of in-pixel digital readouts.

While the use of split bit readouts in these and other applications is beneficial, such use is hampered where output data is not usable due to misalignment of the least significant counter bit (i.e., the LSB of the M most significant bits) and most significant residual bit (i.e. the MSB of the N least significant bits).

SUMMARY OF THE INVENTION

Various deficiencies in the prior art are addressed below by a system, device, apparatus and method for calibrating a split bit digital readout to avoid misalignment of the least significant counter bit (i.e., the LSB of the M most significant bits) and most significant residual bit (i.e. the MSB of the N least significant bits). For example, various embodiments provide a field programmable gate array (FPGA), digital signal processing (DSP) function and the like configured to calibrate one or many split bit digital readouts such as may exist on a digital pixel sensor (DPS) or other device.

Various embodiments contemplate calibrating a split digit measurement system wherein, for each integration frame, most significant bits (MSBs) of a measurement are received from a charge packet counter and least significant bits (LSBs) of the measurement are received from an analog to digital converter (ADC) configured to measure a residual charge of an integrating capacitor, and having a calibration mode operative for receiving LSB measurements (LSBmeas) from the ADC for each of a plurality of calibration frames, the calibration frames comprising integration frames having different integration times, the plurality of received LSB measurements comprising a calibration set of LSB measurements; mapping a lowest value LSB measurement (low) within the calibration set to a minimum range value (minrange); mapping a highest value LSB measurement (high) within the calibration set to a maximum range value (maxrange); calculating a gain value (gain)=(maxrange−minrange)/(high−low); and calculating an offset value (offset)=minrange−gain*low; and having a measurement mode operative for receiving MSB measurements (MSBmeas) from the in-pixel counter and corresponding LSB measurements (LSBmeas) from the ADC for each of a plurality of measurement frames; calculating a corrected LSB measurement (LSBcorrected)=LSBmeas*gain+offset; and generating a frame measurement by concatenating the corresponding MSB measurement (MSBmeas) and corrected LSB measurement (LSBcorrected).

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

Figure 1:
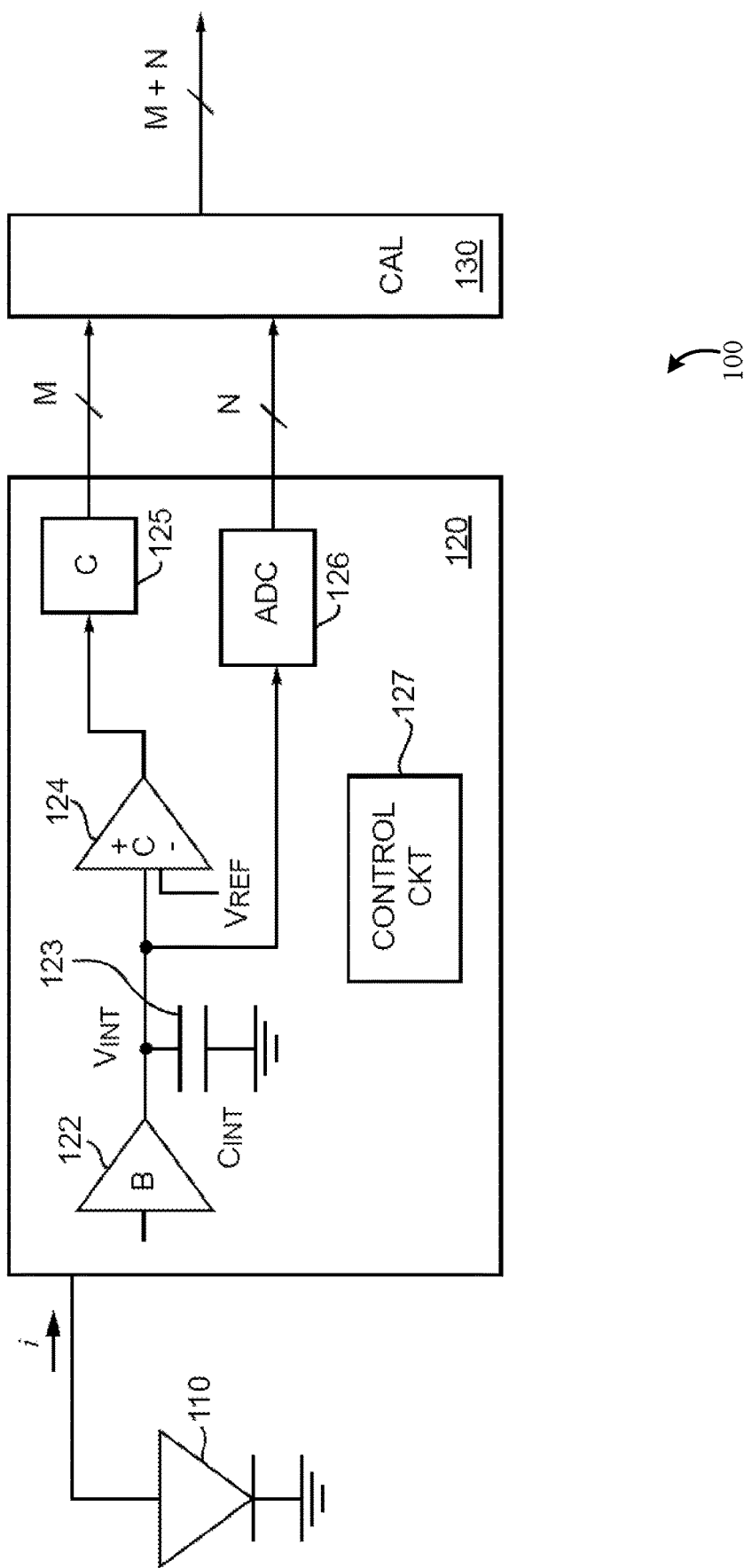
FIG. 1 depicts a high level block diagram of a system according to an embodiment.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for illustrative purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments.

Various embodiments provide a system, method, apparatus, mechanism and the like for calibrating a split bit digital readout to avoid misalignment of the least significant counter bit (i.e., the LSB of the M most significant bits) and most significant residual bit (i.e. the MSB of the N least significant bits). For example, various embodiments provide a field programmable gate array (FPGA), digital signal processing (DSP) function and the like configured to calibrate one or many split bit digital readouts such as may exist on a digital pixel sensor (DPS) or other device.

FIG. 1 depicts a high level block diagram of a system according to an embodiment. Specifically, FIG. 1 depicts a digital pixel sensor (DPS) 100 comprising a detector 110 (e.g., photo detector, infrared detector and the like) configured to supply a current i to a signal processing circuit 120 operative to sense the detector current i and responsively generate a split bit digital readout comprising M most significant bits and N least significant bits, wherein the split bit digital readout is further processed by a calibrator 130 to avoid misalignment thereof, such as described in more detail below. In the disclosed embodiments, the detector current i is a current indicative of received light, such as incoming photons (or energy for bolometers).

The signal processing circuit 120 may comprise, illustratively, a buffer 122 four buffering the received detector current i and generate thereby a corresponding voltage signal VINT across and integrating capacitor 123. The corresponding voltage signal VINT is provided to one input of a comparator 124 as well as an analog to digital converter (ADC) circuit 126. The output of the comparator 124 is used to trigger a charge packet counter 125. Control circuitry 127 causes the signal processing circuit 122 operate in a known manner to generate, for each of a sequence of integration periods, the split bit digital readout in which the charge packet counter 125 generates the M most significant bits of the readout and the ADC 126 generate the N least significant bits of the readout. Specifically, for each of a plurality of integration frames the charge packet counter 125, illustratively an in-pixel counter, is configured to generate M counter bits representing an initial charge stored at the integrating capacitor 123 at a start of an integration frame, while the ADC 126 is configured to generate N residual bits representing a residual charge stored at the integrating capacitor 123 at an end of an integration frame.

The calibrator 130 comprises sequential logic, combinational logic, programmable logic or any combination thereof configured to perform a calibration/processing method according to the various embodiments herein to avoid misalignment of the M most significant bits and N least significant bits of the digital readout generated by the signal processing circuit 120. The calibrator 130 may operate in a calibration mode in which a plurality of integration frames are used to perform a calibration function as described below with respect to FIG. 2. After the correction is applied, the M counter and N residual bits are combined/concatenated to produce a digital readout word of M+N bits which may be used for further processing (not shown).

The calibrator 130 may be implemented in a field programmable gate array (FPGA) or other computational resource, which resource may be fabricated along with the relevant sensor 110 and signal processing circuit 120. That is, in various embodiments, the signal processing circuitry 120 and corresponding calibrator 130 are formed upon the same integrated circuit. In various embodiments, each of a plurality of pixels or sensor elements within a plurality of pixels/sensors (e.g., a grid or array of pixel/sensors) is formed upon a common substrate or integrated circuit along with a respective signal processing circuit 120 and calibrator 130.

Generally speaking, the various embodiments provide a mechanism for calibrating the readout so that the least significant counter bit and most significant residual bit are in alignment by (1) collecting input frames at many integration times to produce a uniformly distributed number of residual electrons and consequently the residual digital counts (i.e., likely includes true zero and true full well); (2) using the residual digital counts to solve for offset and gain in terms of high and low values (0 Bits=low*gain+offset; MaxBits=high*gain+offset); and (3) remapping the values to remove gaps in the data using the resulting equation: corrected=measured*gain+offset, to provide M+N bit depth data that can be further processed by, e.g., conventional non-uniformity correction algorithms.

One embodiment is implemented as a FPGA add-on to a digital readout imaging system, where recalibration can be invoked manually, periodically and/or if 1/f noise causes a large enough drift. Other (less preferred) embodiments contemplate driving the variance of the signal high and/or using a controllable source such as a blackbody placed in front of the sensor.

Figure 2:
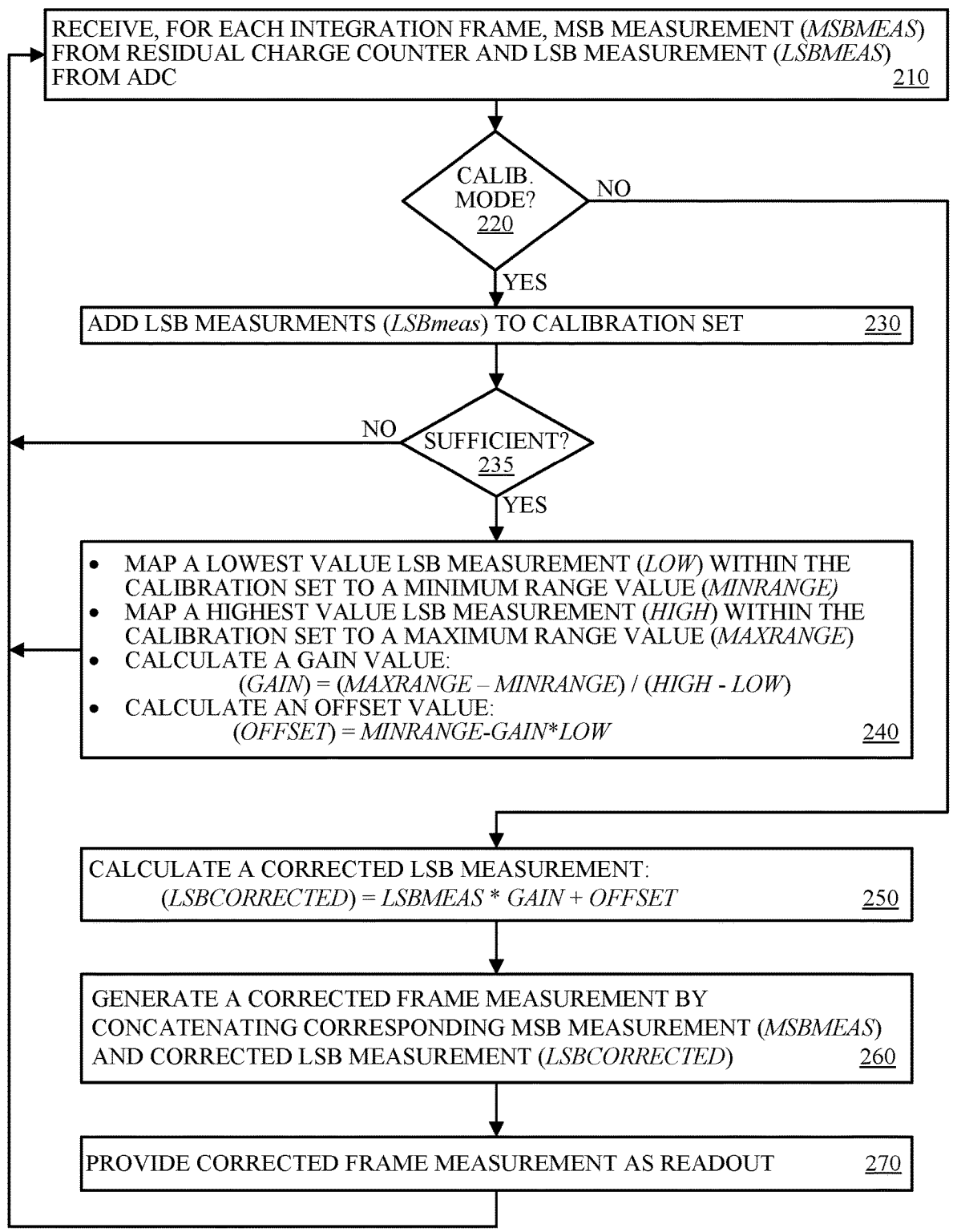
FIG. 2 depicts a flow diagram of a split-bit digital readout processing method according to an embodiment.

FIG. 2 depicts a flow diagram of a split-bit digital readout processing method according to an embodiment. Specifically, the method 200 of FIG. 2 is suitable for use in, illustratively, the calibrator 130 depicted above with respect to FIG. 1. The methods 200 is suitable for calibrating a split digit measurement system wherein, for each integration frame, most significant bits (MSBs) of a measurement are received from a residual charge counter and least significant bits (LSBs) of the measurement are received from an analog to digital converter (ADC).

At step 210, the method receives, for each of a sequence of integration frames of the same or differing duration, MSB measurements (MSBmeas) of M bits such as from charge packet counter 125 and LSB measurements (LSBmeas) of N bits such as from ADC.

At step 220, a determination is made as to whether the calibrator 130 is operating in a calibration mode. If operating in a calibration mode, then the method proceeds to step 230. Otherwise the method proceeds to step 250. A calibration mode may be entered periodically based on time between calibrations (e.g., every 10 seconds, 100 second etc.), number of measurements (e.g., every 1000 measurements, 10000 measurements etc.) or in response to a calibration control signal or command received from a processor, DSP or other controlling/managing element within or external to chip, module or functional element operative in accordance with the teachings herein (e.g., an image processor, computer and the like). Thus, the calibration mode may be repeated in response to any of periodic schedule and a received calibration command.

At step 230, the received LSB measurements (LSBmeas) is added to a calibration set of LSB measurements being formed. In various embodiments the calibration set is zeroed or reset at the start of a calibration cycle. In various embodiments, the calibration set includes LSB measurements received during a non-calibration mode (i.e., measurement mode).

At step 235, a determination is made as to whether the accumulated calibration that is sufficient for calibration purposes. Various embodiments, calibration set may comprise a predetermined number of measurements (e.g., more than 10, more than 100 and so on) or may comprise a number of measurements retrieve within a predefined time period (e.g., one second, 10 seconds and the like). If the calibration set is insufficient, then the method proceeds to step 210 where the next measurements are received. Otherwise the method proceeds to step 240.

At step 240, the calibration set is used to generate gain and offset values suitable use in correcting the received M-bit MSB measurements (MSBmeas) and N-bit LSB measurements (LSBmeas) to provide thereby corrected readout measurements of a particular integration frame. Specifically, at step 240 the method performs the following sub-steps and then proceeds to step 210 within the next measurements are received:

(1) mapping a lowest value LSB measurement (low) within the calibration set to a minimum range value (minrange);
(2) mapping a highest value LSB measurement (high) within the calibration set to a maximum range value (maxrange);
(3) calculating a gain value (gain)=(maxrange−minrange)/(high−low); and
(4) calculating an offset value (offset)=minrange−gain*low.

At step 250, a measurement received in a non-calibration mode is processed by correcting the received N-bit LSB measurement (LSBmeas) as follows:

(LSBcorrected)=LSBmeas*gain+offset; and

At step 260, a corrected frame measurement is generated by concatenating the received M-bit MSB measurement (MSBmeas) and the corrected N-bit LSB measurements (LSBcorrected), which corrected frame measurement is provided as a readout or for other purposes as step 270. The method proceeds to step 210 where the next measurements are received.

The first step to calibration is to collect frames at many integration times to produce a uniformly distributed number of residual electrons and consequently the residual digital counts. Since there is no knowledge of the incoming signal or the system response assumed, this gives the highest probability that values were measured that correspond to true zero and true full well. When digitized, there will be some forbidden values at the upper and lower end of the dynamic range.

As an example, assume that a set of calibration data was digitized to 12 bits giving a range of possible values from 0 to 4095, but the data only occupies from 450 to 3650 for this particular pixel. Since the number of electrons was forced to be uniformly distributed, the minimum value measured in digital numbers can be mapped to 0 and the maximum can be mapped to the largest value possible, in this case 4095. This produces the following equations:

0=low*gain+offset

4095=high*gain+offset

Solving for offset and gain in terms of the high and low values found gives the following results:

gain=4095/(high−low)=4095/(3650−450)=4095/3200=1.28

Thus, in a non-calibration mode (i.e., a measurement mode) each received N-bit LSB measurement is corrected and used as part of a corrected readout measurement. In this manner, the corrected LSB measurements operate to remap the values on the residual bits to the full range of values available, while removing any gaps in the data. Similar processing may be performed using a set of calibration data was digitized to 16 bits giving a range of possible values from 0 to 65535, or 8-bits (0-256) and so on.

It is contemplated that the various embodiments may be implemented on an FPGA attached to a digital readout imaging system and for each pixel therein, wherein the embodiment will sweep the integration times and collect values for each pixel's residual bits. This value is compared against a value in memory for the minimum and the maximum seen and replaces the values in memory if it is less or greater respectively. The gain and offset can be calculated after the calibration sweep has completed which can be used to calibrate the residual bits on subsequently collected imagery. Since the calibration can be carried out regardless of signal, the sensor can be recalibrated if the 1/f noise causes a large enough drift. It is also contemplated that the various embodiments may be implemented by a general purpose computing device, such as described below with respect to FIG. 3.

Two further embodiments contemplate variations on the manner used to collect data at the endpoints of the data. The first is to place an extremely bright source in front of the system which drives the variance of the signal high. The second is to place a controllable source such as a blackbody in front of the sensor and collect data while the blackbody temperature is varied. These methods may be used together to establish the high (bright) and low (dark) ranges of measurement readings for a particular pixel processing channel.

Advantageously the various embodiments enable the use of an increased well depth from split bit digital readouts, which improves the SNR but leads to potential non-linearities, by enabling frequent recalibration to compensate for such non-linearities.

Advantageously, the various embodiments find particular utility within the context of as infrared searching or tracking, infrared imaging of the Earth from aerial/space platforms where the sensor must be periodically calibrated to maintain performance and so on.

Figure 3:
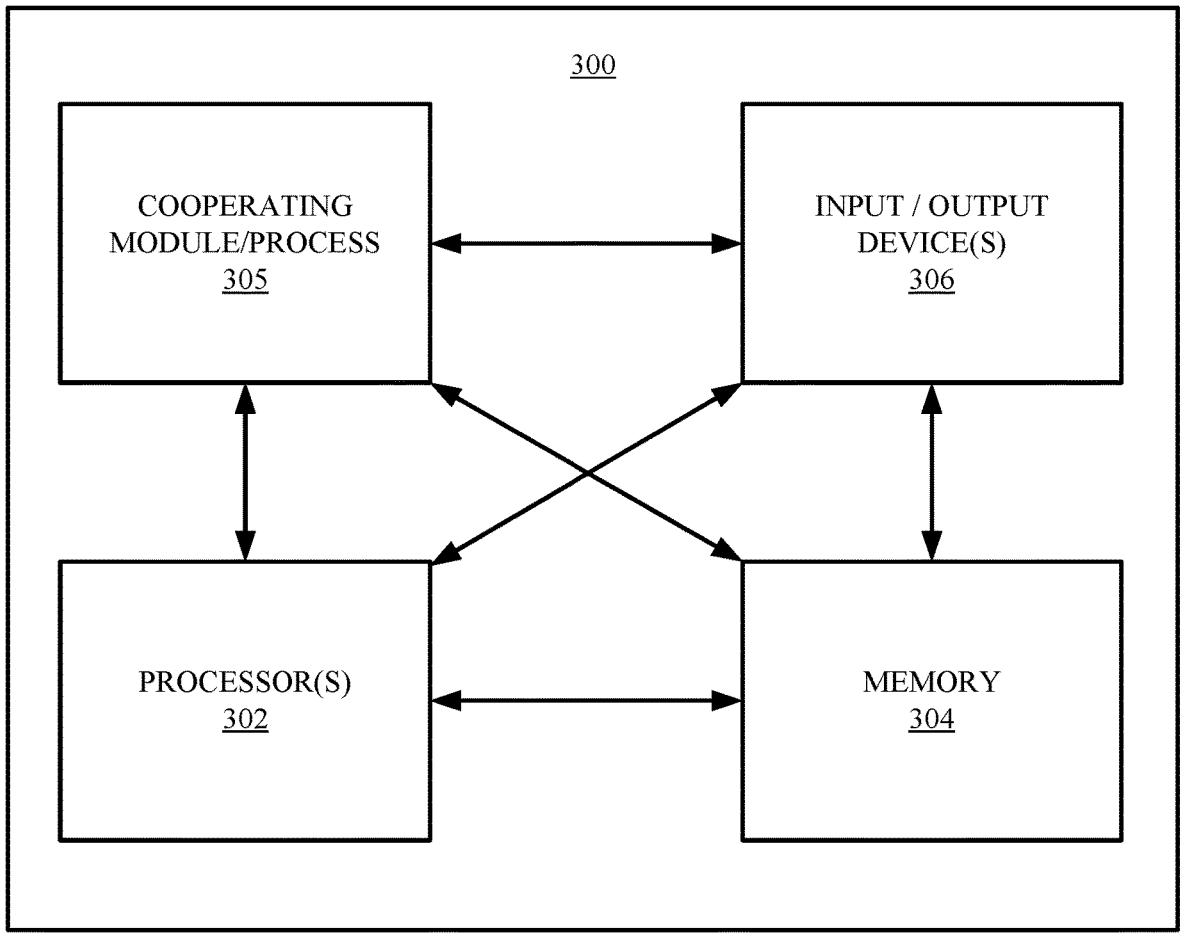
FIG. 3 depicts a high-level block diagram of a computing device suitable for use in performing functions according to the various embodiments.

FIG. 3 depicts a high-level block diagram of a computing device suitable for use in performing functions according to the various embodiments, such as calibrator 130 and/or a control module in communication therewith (e.g., a control module communicating with multiple calibrators 130 in module processing split readout information such as a digital pixel sensor (DPS) utilizing for each pixel a respective read out integrated circuitry (ROIC) die including an ADC. Further, the computing device 300 is suitable for use in performing various functions described herein, such as those associated with the various elements described herein with respect to the figures (e.g., calibrator 130, control circuit 127 and other circuits/modules as discussed herein).

As depicted in FIG. 3, computing device 300 includes a processor element 302 (e.g., a central processing unit (CPU) or other suitable processor(s)), a memory 304 (e.g., random access memory (RAM), read only memory (ROM), and the like), a cooperating module/process 305, and various input/output devices 306 (e.g., communications modules, network interface modules, receivers, transmitters and the like).

It will be appreciated that the functions depicted and described herein may be implemented in hardware or in a combination of software and hardware, e.g., using a general purpose computer, one or more application specific integrated circuits (ASIC), or any other hardware equivalents. In one embodiment, the cooperating process 305 can be loaded into memory 304 and executed by processor(s) 302 to implement the functions as discussed herein. Thus, cooperating process 305 (including associated data) can be stored on a computer readable storage medium, e.g., RAM memory, magnetic or optical drive or diskette, and the like.

It will be appreciated that computing device 300 depicted in FIG. 3 provides a general architecture and functionality suitable for implementing functional elements described herein or portions of the functional elements described herein.

It is contemplated that some of the steps discussed herein may be implemented within hardware, for example, as circuitry that cooperates with the processor to perform various method steps. Portions of the functions/elements described herein may be implemented as a computer program product wherein computer instructions, when processed by a computing device, adapt the operation of the computing device such that the methods or techniques described herein are invoked or otherwise provided. Instructions for invoking the inventive methods may be stored in tangible and non-transitory computer readable medium such as fixed or removable media or memory, or stored within a memory within a computing device operating according to the instructions.

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/arrangements of steps or functional elements may be utilized within the context of the various embodiments. Further, while modifications to embodiments may be discussed individually, various embodiments may use multiple modifications contemporaneously or in sequence, compound modifications and the like.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof. As such, the appropriate scope of the invention is to be determined according to the claims.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. Method for calibrating a split digit measurement system wherein, for each integration frame, most significant bits (MSBs) of a measurement are received from a charge packet counter and least significant bits (LSBs) of the measurement are received from an analog to digital converter (ADC) configured to measure a residual charge of an integrating capacitor, the method comprising:
   in a calibration mode:
      receiving LSB measurements (LSBmeas) from the ADC for each of a plurality of calibration frames, the calibration frames comprising integration frames having different integration times, the plurality of received LSB measurements comprising a calibration set of LSB measurements;
      mapping a lowest value LSB measurement (low) within the calibration set to a minimum range value (minrange);
      mapping a highest value LSB measurement (high) within the calibration set to a maximum range value (maxrange);
      calculating a gain value (gain)=(maxrange−minrange)/(high−low); and
      calculating an offset value (offset)=minrange−gain*low;
   in a measurement mode:
      receiving MSB measurements (MSBmeas) from the in-pixel counter and corresponding LSB measurements (LSBmeas) from the ADC for each of a plurality of measurement frames;
      calculating a corrected LSB measurement (LSBcorrected)=LSBmeas*gain+offset; and
      generating a frame measurement by concatenating the corresponding MSB measurement (MSBmeas) and corrected LSB measurement (LSBcorrected).

2. The method of claim 1, wherein the minimum range value comprises zero and the maximum range value comprises 4095.

3. The method of claim 1, wherein the minimum range value comprises zero and the maximum range value comprises 65535.

4. The method of claim 1, wherein said calibration mode is periodically repeated.

5. The method of claim 1, wherein said calibration mode comprises an initial calibration mode, said method further comprising:
   adding to said calibration set a subset of received measurement mode LSB measurements; and
   repeating said calibration mode in response to any of a periodic schedule and a received calibration command.

6. The method of claim 1, wherein said split digit measurement system is configured to measure current associated with received light.

7. Apparatus, comprising:
an integrating capacitor, configured to store a charge associated with a received sensor signal;
an in-pixel counter, configured to generate, for each of a plurality of integration frames, M counter bits representing an initial charge stored at the integrating capacitor at a start of an integration frame;
an analog to digital converter (ADC), configured to generate, for each of the plurality of integration frames, N residual bits representing a residual charge stored at the integrating capacitor at an end of an integration frame; and
a controller, in a calibration mode, configured to:
receive LSB sensor measurements (LSBmeas) from the ADC for each of a plurality of calibration frames, the calibration frames comprising integration frames having different integration times, the plurality of received LSB sensor measurements comprising a calibration set of LSB sensor measurements;
map a lowest value LSB sensor measurement (low) within the calibration set to a minimum range value (minrange);
map a highest value LSB sensor measurement (high) within the calibration set to a maximum range value (maxrange);
calculate a gain value (gain)=(maxrange−minrange)/(high−low); and
calculate an offset value (offset)=(−gain)*low;
the controller, in a measurement mode, configured to:
receive MSB sensor measurements (MSBmeas) from the in-pixel counter and corresponding LSB sensor measurements (LSBmeas) from the ADC for each of a plurality of measurement frames;
calculate a corrected LSB sensor measurement (LSBcorrected)=LSBmeas*gain+offset; and
generate a frame measurement by concatenating the corresponding MSB sensor measurement (MSBmeas) and corrected LSB sensor measurement (LSBcorrected).

8. The apparatus of claim 7, wherein the minimum range value comprises zero and the maximum range value comprises 4095.

9. The apparatus of claim 7, wherein the minimum range value comprises zero and the maximum range value comprises 65535.

10. The apparatus of claim 7, wherein said calibration mode is periodically repeated.

11. The apparatus of claim 7, wherein said calibration mode comprises an initial calibration mode, said method further comprising:
adding to said calibration set a subset of received measurement mode LSB measurements; and
repeating said calibration mode in response to any of a periodic schedule and a received calibration command.

12. The apparatus of claim 7, wherein said split digit measurement system is configured to measure current associated with received light.

13. The apparatus of claim 7, wherein said apparatus comprises an in-pixel ADC and calibration module, and wherein each of a plurality of pixels is processed via a respective in-pixel ADC and calibration module disposed upon a common read out integrated circuitry (ROIC) die.

14. The apparatus of claim 13, wherein the ROIC die is included within an infrared focal plane array (IRFPA).

15. A tangible and non-transitory computer readable medium storing instructions which, when executed by a computing device, cause the computing device to perform a method of calibrating a split digit measurement system wherein, for each integration frame, most significant bits (MSBs) of a measurement are received from a charge packet counter and least significant bits (LSBs) of the measurement are received from an analog to digital converter (ADC) configured to measure a residual charge of an integrating capacitor, the method comprising:
in a calibration mode:
receiving LSB measurements (LSBmeas) from the ADC for each of a plurality of calibration frames, the calibration frames comprising integration frames having different integration times, the plurality of received LSB measurements comprising a calibration set of LSB measurements;
mapping a lowest value LSB measurement (low) within the calibration set to a minimum range value (minrange);
mapping a highest value LSB measurement (high) within the calibration set to a maximum range value (maxrange);
calculating a gain value (gain)=(maxrange−minrange)/(high−low); and
calculating an offset value (offset)=minrange−gain*low;
in a measurement mode:
receiving MSB measurements (MSBmeas) from the in-pixel counter and corresponding LSB measurements (LSBmeas) from the ADC for each of a plurality of measurement frames;
calculating a corrected LSB measurement (LSBcorrected)=LSBmeas*gain+offset; and
generating a frame measurement by concatenating the corresponding MSB measurement (MSBmeas) and corrected LSB measurement (LSBcorrected).

16. The method of claim 15, wherein the minimum range value comprises zero and the maximum range value comprises one of 4095 and 65535.

17. The method of claim 15, wherein said calibration mode is periodically repeated.

18. The method of claim 15, wherein said calibration mode comprises an initial calibration mode, said method further comprising:
adding to said calibration set a subset of received measurement mode LSB measurements; and
repeating said calibration mode in response to any of a periodic schedule and a received calibration command.

19. The method of claim 15, wherein said split digit measurement system is configured to measure current associated with received light.

20. The method of claim 15, wherein method is executed at each of a plurality of calibration modules, each calibration module operative to process information provided by a respective a respective in-pixel analog to digital converter (ADC).

* * * * *